United States Patent [19]

Sussmann

[11] 4,089,735
[45] May 16, 1978

[54] METHOD FOR EPITACTIC PRECIPITATION OF CRYSTALLINE MATERIAL FROM A GASEOUS PHASE, PARTICULARLY FOR SEMICONDUCTORS

[75] Inventor: Erhard Sussmann, Poing, Germany

[73] Assignee: Siemens Aktiengesellschaft, Berlin & Munich, Germany

[21] Appl. No.: 356,408

[22] Filed: May 2, 1973

Related U.S. Application Data

[63] Continuation of Ser. No. 164,897, Jul. 21, 1971, abandoned, which is a continuation of Ser. No. 830,759, Jun. 5, 1969, abandoned.

[30] Foreign Application Priority Data

Jun. 5, 1968 Germany .............................. 1769520

[51] Int. Cl.² .................. H01L 21/205; H01L 21/306
[52] U.S. Cl. .................................... 156/612; 118/49.5; 118/72; 148/174; 148/175; 156/613; 156/614; 156/662; 427/86
[58] Field of Search ............... 117/108 A, 201, 107.1; 118/49, 50, 48, 49.1, 49.5, 72; 148/174, 175; 156/17, 612, 613, 614; 427/86, 307

[56] References Cited

U.S. PATENT DOCUMENTS

| 2,877,138 | 3/1959 | Vodonik ...................... 117/107.1 X |
| 3,148,094 | 9/1964 | Kendall ................................. 148/175 |
| 3,171,755 | 3/1965 | Reuschel et al. ............ 117/106 A X |
| 3,341,376 | 9/1967 | Spenke et al. ......................... 148/175 |
| 3,392,069 | 7/1968 | Merkel et al. ......................... 156/17 |
| 3,394,679 | 7/1968 | Bentley ................................... 118/49 |
| 3,428,500 | 2/1969 | Maeda .............................. 148/174 X |
| 3,501,336 | 3/1970 | Dyer et al. ....................... 117/106 A |
| 3,602,192 | 8/1971 | Grochowski et al. ................. 118/48 |
| 3,669,774 | 6/1972 | Dismukes .............................. 156/17 |
| 3,672,948 | 6/1972 | Foehring .......................... 118/48 X |

*Primary Examiner*—Harris A. Pitlick
*Attorney, Agent, or Firm*—Herbert L. Lerner

[57] ABSTRACT

Described is a method of epitactic precipitation of crystalline material from the gaseous phase, upon substrate bodies. The carrier of the substrate bodies is moved in the reaction vessel during the precipitation process. At least one transport member, which carries the substrate bodies to be coated, is passed through locks into the reaction chamber, which is provided with the required reaction conditions and following precipitation, during which the reaction conditions are being maintained, is passed through locks out of the reaction chamber.

2 Claims, 4 Drawing Figures

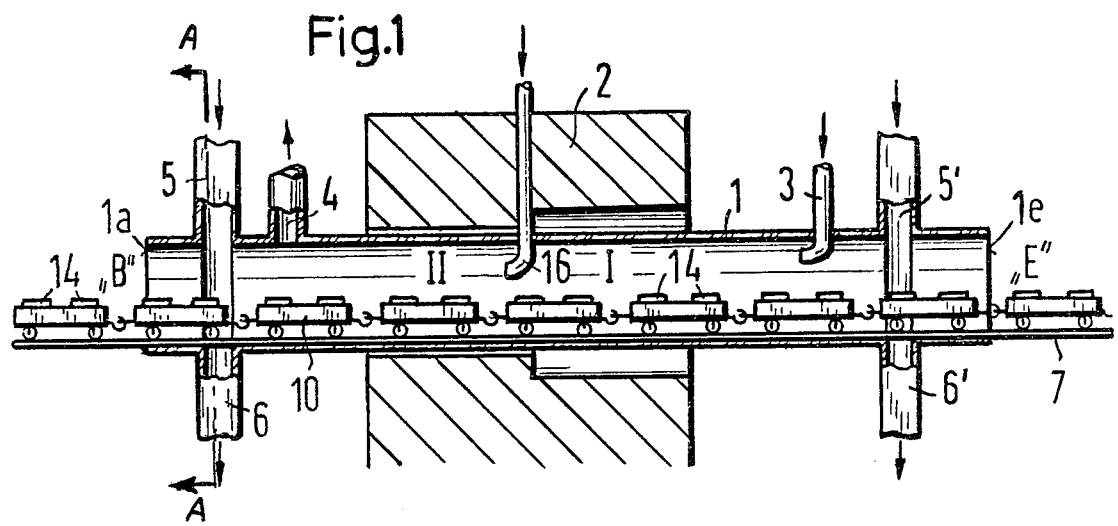
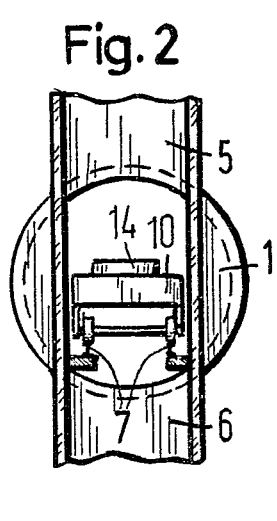
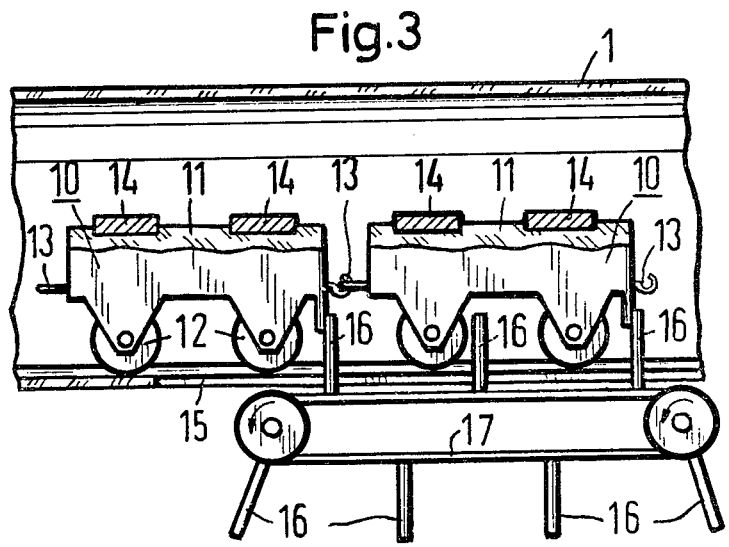
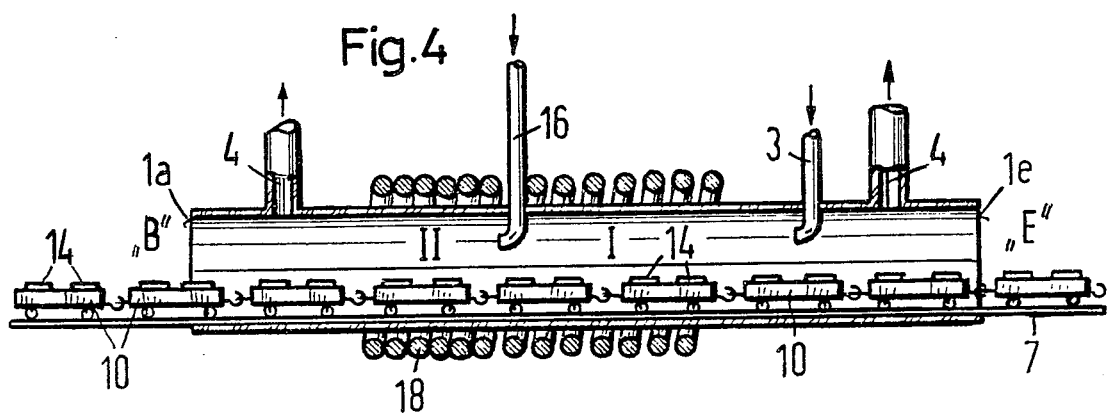

METHOD FOR EPITACTIC PRECIPITATION OF CRYSTALLINE MATERIAL FROM A GASEOUS PHASE, PARTICULARLY FOR SEMICONDUCTORS

This is a continuation of application Ser. No. 164,897, filed July 21, 1971 and now abandoned which in turn is a streamlined continuation of application Ser. No. 830,759, filed June 5, 1969 and now abandoned.

My invention relates to a method for precipitating by epitaxy crystalline material from the gaseous phase, more particularly semiconductor material. To this end, it is customary to heat the substrate bodies, more particularly semiconductor wafers up to precipitation temperature and in a reaction gas which delivers the material to be precipitated at elevated temperatures. Normally, these substrate bodies are heated to the temperature required for reaction, with the aid of a heated carrier. To promote uniformity of precipitation, it is known to introduce the reaction gas which circulates the substrate wafers to be coated, into the reaction chamber by means of a movable supply member, such as a movable nozzle. It is also known to work instead with a stationary gas supply and to use a rotating base for the wafers to be coated.

It is the object of the present invention to develop a continuous method for the epitactic precipitation wherein the substrate wafers to be coated are continuously passed through a, particularly tubular, reaction vessel. This increases the manufacturing rate. Moreover, the use of the method, disclosed in detail in the following, affords a very homogeneous epitactic layer with respect to specific resistance and layer thickness, since, as shall be soon seen, inhomogeneities in the composition of the reaction gas are eliminated in the present method, or at least minimized.

The invention relates to a method for epitactic precipitation of crystalline material, more particularly semiconducting material, from a gaseous phase upon substrate bodies, particularly semiconductor wafers, whereby the carrier of the substrate bodies is moved in the reaction vessel, during the precipitation process. The invention provides, to this end, that at least one transport member, which carries the substrates to be coated, be passed through a lock into the reaction chamber, provided with the required reaction conditions and, following the precipitation process during which said conditions are maintained, be discharged again through a lock from at least one reaction zone of said reaction chamber.

An essential further development of the invention is that all apparatus portions having contact with the reaction gas, including the transporting member, consist, at least at the surface, of highly-pure $SiO_2$, SiC or $Si_3N_4$. A favorable combination is the use of graphite apparatus parts whose surfaces are provided with a dense coating of SiC. When such apparatus parts are used, which do not contaminate the reaction gas, the same purity can be obtained by using the disclosed method, also in connection with silicon and germanium epitaxy that is used in association with the conventionally sealed reaction vessels.

Another significant feature is the continuous passing of the wafers in the form of a "vehicular chain" in and out of the entire reaction chamber from the entrance lock to the exit lock and which is loaded or unloaded outside of the reaction vessel according to the working rhythm. The chain can be comprised either of a number of horizontally positioned vehicles in sequence, e.g. attached to each other or, where a vertical reaction tube is employed, can consist of a number of transport members vertically stacked above each other.

As aids for locks passing the vehicles loaded with the wafers, particularly semiconductor discs, in and out, the invention further provides specially arranged currents of inert auxiliary gases which will be described in greater detail. In special cases, these gas locks can be dispensed with.

Details of the invention will be disclosed, further described with respect to the drawing, wherein:

FIG. 1 is a device with gas locks, while
FIG. 2 is a cross section through AA of FIG. 1;
FIG. 3 is a tub-shaped transporting member; and
FIG. 4 is a particularly simple apparatus.

A horizontally placed quartz tube 1, preferably with rectangular cross section, extends through a tubular furnace 2. Other energy sources can be employed in lieu of the tubular furnace, such as for example a device producing a magnetic field, particularly a high-frequency field, which effects inductive heating of the wafers to be coated or of their carriers. The reaction gas required for epitaxy, is supplied to the device at 3, flows through the actual reaction chamber that constitutes the inside of the quartz tube, and leaves at 4. This tube, however, extends in both directions and is open at its ends 1a and 1e. As seen from the location of the heating device 2, there is a protective gas curtain beyond the points 3, 4 for the flowing reaction gas. For this purpose opposed gas inlets and gas outlets 5, 6 and 5', 6' are provided.

As shown in FIG. 2, the reaction tube 1 forms at this place a square neck into which the inlet pipes 5, 5' and the outlet pipes 6, 6' end, opposite each other. Thus, an escape of the reaction gas flowing in the reaction chamber is prevented by a high pressure or velocity of the protective gas through the best possible elimination of obstructions of the protective gas, flowing out of pipes 5 and 5' and flowing into pipes 6 and 6'. (An introduction of the protective gas into the reaction chamber is generally considered harmless). At any rate, the pressure in the gas curtain should be higher than the pressure in the reaction chamber, in order to keep the losses of reaction gas as low as possible.

FIG. 3 shows a transport member in the form of a carriage or cart loaded with the wafers to be coated. This carriage is comprised of an appropriately heat-resistant, inert material. It is preferable that parts of this carriage consist, at least at their surface, of dense, highly-pure $SiO_2$, SiC or $Al_2O_3$. Such coatings can be obtained in a highly pure form, by precipitation from the gaseous phase. When it is desired to heat inductively the wafers to be coated, provided that the wafers are comprised of highly-pure material, a carriage will be used, whose load bridge 11 and wheels 12 are comprised of tantalum and coated with one of the aforementioned materials. Highly-pure graphite can also be utilized as a material for these vehicles. When such a carriage reaches an electromagnetic alternating field which crosses the reaction tube and has sufficient intensity, the carriage and the substrate wafers, located thereon, will be heated to the required high temperature.

Instead of the carriages 10, it is also possible to use differently equipped vehicles, such as sleds.

The use of a vertically held reaction tube is also possible. In this instance, the vehicles with the semiconductor wafers to be coated can be passed through the device in a conveyor operation. However, when vehicles which glide in guides are being used, attention must be paid to the fact that their operation easily loosens dust particles which can result in the occurrence of atomic disturbances in the desired monocrystalline growth of the precipitated layers.

As shown in FIG. 3, the substrate wafers 14 can be installed into recesses in the load bridges 11. In the example, these recesses constitute only an edge support. The carriage can also be provided with a coupling device 13, which affords connection of one carriage to the other.

FIG. 1 illustrates a chain of carriages 10, which crosses the reaction tube 1, extending from the loading locality "B", through the entire reaction tube 1, to the unloading place "E". According to the operational rhythm associated with the device, new carriages 10 are constantly attached at loading place B and detached at the unloading place E, with the complelely coated wafers. The carts are then reloaded and reused, following a cleaning process if necessary.

In the embodiment example described in FIG. 1, the vehicle chain is guided in the reaction tube 1, opposing the flow of the reaction gas. This measure is recommended if, due to the output of semiconductor material, the reaction gas gains the capacity of having an etching effect upon the substrate wafers and the precipitated semiconductor material. This property is known to be present when semiconductor materials, such as silicon or germanium, are precipitated when halogen and hydrogen containing reaction gases are used. Accordingly, the part of the reaction chamber, arranged within the furnace, is subdivided into reaction portions I and II, whereby region part I constitutes the actual precipitation region and region part II constitutes the preparation of the substrate wafers 14 for the precipitation process by the withdrawing reaction gas. In order to support the effect in region part II, an additionally etching gas, e.g. HCl, can be so introduced at location 16, as shown in FIG. 1, that it enters region part II but not region part I. For this purpose, the tubular inlet point 16 is bent in the direction of region part II.

In the interest of a lesser technical effort, an object is to arrange the parts of the reaction tube, where the carriages containing the wafers to be coated are passed in and out, as far as possible from the furnace, so that they will be maintained at room temperature. The carriages with the wafers to be coated then pass on both sides of the furnace through a temperature field with gradients. As a result, precipitation is fundamentally feasible outside of the actual precipitation region. Contrary to the actual precipitation region I, the temperatures which prevail outside said region and also the other conditions are not such as to produce the precipitated material in the desired monocrystalline condition. This applies particularly to the region to the left from the partial regions I and II. Thus, the region part II effects a removal of any undesired precipitated material from the surface of wafer 14, as well as from the surface of the transporting vehicles 10. Moreover, it is preferable if the original surface of the substrate wafer 14 is also freed from atomic disturbances by means of etching. At any rate, an addition of etching gas is provided at point 16 so as to ensure an adequate etching process. Moreover, the wafers can be moved through such critical regions much faster than through region part II and primarily in region part I. Finally, by using an appropriate heating device, the temperature for region II can be so selected, deviating from region I, that the removing processes in partial region part II would also be promoted thereby. When the present method is applied to semiconductors such as silicon, this means that region part II is at a higher temperature than region part I.

Several possibilities are open for operating, within the reaction tube, with variable velocities of vehicles 10, carrying the wafers 14. For instance, the vehicles may be individually pulled or pushed, through the apparatus, e.g. automatically, with the aid of a wire comprised of inert material, such as tantalum.

If, in accordance with FIG. 1, operation is effected with a continuous chain of vehicles, then by an appropriate adjustment of distances of the wafers 14 to the lengths of region parts I and II, it is easy to ensure that wafers 14 are simultaneously present or that no wafers at all are present, at the input to the region part II, as well as at the junction to region part I and in the connecting region, at the other end. It is then always easy to move the vehicle chain at a fast speed if any wafers 14 are present in this region since, at the same time, wafers are being moved through the other regions with strong temperature gradients. Due to the fact that the wafers are distributed in equidistant groups, along the entire vehicle chain and, since the regions having a strong temperature transfer are narrow in relation to the distances between said disc groups (to which preferably an individual vehicle is assigned) and, also, in relation to the still larger length dimension of region parts I and II, the preceding group will always have left the critical regions, before the next group enters these regions. Thus, the opportunity is afforded, during the thus defined pauses (during which wafers 14 can naturally be present, and usually are present, outside the heating regions and in region parts I and II), to feed with considerably slower speeds, particularly also at zero velocity and thereby to provide the wafers in the region portions, with adequate treatment opportunities, for the processes being carried out in region parts I and II.

The following details should also be pointed out: It is preferable to guide carriages 10 along rails 7, in order to provide a defined run through the reaction tube 1. Particularly when the carriage chain, being driven from the tube ends, is pulled or pushed through the device, it is recommended to couple mechanically the carriages to each other, e.g. with the aid of hooks and eyes comprised of quartz. Such a coupling is shown in FIG. 3 at 13.

Finally, a chain drive is also feasible for the carriages carrying the wafers to be coated. In this method, the reaction tube is provided, over its entire length or over a portion of its length, with a straight-line slit which can run e.g. between the two rails 7. As seen in FIG. 3, thorn-like projections 16 of a transporting tool 17, preferably designed as an endless band, e.g. a chain comprised of tantalum, protrude through this slit 15. The band is parallel along the slit, but outside the reaction tube. The thorn-like projections make mechanical contact with the carriages 10 and serve as their drive. Although the possibility had been mentioned to extend this type of drive, i.e. the slit necessary thereto, across the entire tube length, a considerably shorter length is preferable in a great many cases. Most of all it is preferable to arrange such a drive only outside partial regions I and II and, if necessary, even outside the gas trap which is provided for a device according to FIG. 1. The use of a second, preferably transparent tube surrounding the reaction tube 1 and simultaneously containing at least a portion of the transport device is also preferred.

Another embodiment of an apparatus used for the method according to the invention, is seen in FIG. 4. Contrary to a device according to FIG. 1, the carriages 10 are in this instance comprised of electricity-conducting material, and are heated by the field of an induction coil 18, which heats the carriages 10 in the region part II a little more strongly than in region part I. The tubular inlet for the etching gas marks the boundary between partial regions I and II. The supply points for the fresh reaction gas 3 are also provided by tubes which are bent in the direction toward region I opposite the movement of carriages 10. As a result, the fresh reaction gas is blown directly into region I. The gas then flows to the gas outlet 4. The latter is coupled with a suction pump, which prevents the reaction gas from reaching, during the operational process, the open end of the reaction tube 1, at B. The gas trap in FIG. 1 is thus replaced here by an effective exhaust device. The same applies also to the second gas trap of the device according to FIG. 1.

Since in a given speed program which is obligatory for all vehicles and, thus also, for wafers 14, all wafers are led during their travel through the reaction tube, according to the same conditions, a high degree of uniformity can be expected with respect to the quality of the obtained epitactic layers. This is particularly true as the actual precipitation region I contains only relatively few substrate wafers and, therefore, the changes in the reaction combination along its flow and thus, in travel direction of the wafers, caused by the chemical growth reaction which is the main reason for the variable doping, remains small. As a result, a high uniformity of doping is obtained in the precipitated semiconductor wafers. The thickness of the wafers is also very homogeneous for analogous reasons. A high uniformity for the precipitated wafers is actually a characteristic of small precipitation apparatus which can be equipped with only a few wafers at a time, but which are, for the same reason, uneconomical.

The method of the present invention thus combines the advantage of a high uniformity for the qualities of the obtained wafers and the advantages of high output.

I claim:

1. Continuous method of etching and epitactic precipitation of monocrystalline layers of a semiconductor of the group consisting of silicon and germanium upon monocrystalline substrate wafers of the same semiconductor, which comprises placing monocrystalline substrates upon movable carriers of inert material, continuously passing said carriers through a tubular reaction vessel having an inlet point at one end and an outlet point at the other end, heating said carriers with said substrate wafers in the reaction vessel first through a zone II of a first, higher temperature and immediately thereafter through an adjacent zone I of a second, lower temperature, while introducing into the reaction vessel countercurrent to the movement of the substrate wafers a gas consisting of the halide of the semiconductor to be precipitated and hydrogen, the second temperature being at a value which effects epitactic precipitation from the gas of monocrystalline layers of the semiconductor on the substrate wafer in the zone I and the first temperature being at a value which effects etching of the surfaces of the substrate wafers in the zone II by the gas exhausting from the zone I through the zone II.

2. The method of claim 1, wherein an etching gas is added to said gas.

* * * * *